United States Patent [19]
Besserer et al.

[11] Patent Number: 5,932,843
[45] Date of Patent: Aug. 3, 1999

[54] SWITCHGEAR CABINET WITH A FRAME AND DOOR ELEMENTS

[75] Inventors: Horst Besserer, Herborn; Udo Münch, Sinn; Markus Neuhof, Ehringshausen-Niederlemp; Walter Nicolai, Buseck; Adam Pawlowski, Eschenberg-Wissenbach; Matthias Schüler, Dietzhölztal; Heinrich Strackbein, Biebertal, all of Germany

[73] Assignee: Rittal-Werk Rudolf Loh GmbH & Co., KG, Herborn, Germany

[21] Appl. No.: 08/894,335

[22] PCT Filed: Feb. 6, 1996

[86] PCT No.: PCT/EP96/00473

§ 371 Date: Dec. 29, 1997

§ 102(e) Date: Dec. 29, 1997

[87] PCT Pub. No.: WO96/27228

PCT Pub. Date: Sep. 6, 1996

[30] Foreign Application Priority Data

Feb. 27, 1995 [DE] Germany ............... 195 06 744

[51] Int. Cl.[6] .................................................. H01J 5/00
[52] U.S. Cl. .......................................... 174/50; 312/265.5
[58] Field of Search ................ 174/50, 66; 220/3.8, 220/241, 242; 70/158, 160; 312/265.1, 265.2, 265.3, 265.4, 265.5, 257.1; 361/601, 602, 673

[56] References Cited

U.S. PATENT DOCUMENTS

| | | | |
|---|---|---|---|
| 4,040,694 | 8/1977 | Lascarrou | 312/263 |
| 4,206,956 | 6/1980 | Lydmar | 312/265.4 |
| 4,973,110 | 11/1990 | Nyquist | 312/265.3 |
| 5,228,762 | 7/1993 | Mascrier | 312/265.4 |
| 5,292,189 | 3/1994 | Lau et al. | 312/265.3 |
| 5,372,262 | 12/1994 | Benson et al. | 211/26 |
| 5,536,079 | 7/1996 | Kostic | 312/265.3 |
| 5,639,150 | 6/1997 | Anderson et al. | 312/265.3 |

FOREIGN PATENT DOCUMENTS

| | | |
|---|---|---|
| 0533555 | 3/1993 | European Pat. Off. . |
| 0630088 | 12/1994 | European Pat. Off. . |
| 2298296 | 8/1976 | France ............... 312/265.1 |
| 2681403 | 3/1993 | France . |
| 1910658 | 10/1969 | Germany . |
| 4013381 | 7/1991 | Germany . |
| 4132803 | 4/1993 | Germany . |
| 4336188 | 4/1995 | Germany . |
| 598703 | 5/1978 | Switzerland . |
| 9309697 | 5/1993 | WIPO . |

*Primary Examiner*—Kristine Kincaid
*Assistant Examiner*—Dhiru R Patel
*Attorney, Agent, or Firm*—Pauley Petersen Kinne & Fejer

[57] ABSTRACT

A switchgear cabinet with a frame and door elements. A side of the switchgear cabinet can be closed by an angle door element or by two superimposed door elements, a type of rabbet being optional, as a result of connection elements being mounted in pairs on vertical frame legs and aligned on a horizontal center plane in conjunction with suitably aligned closing and hinge elements.

20 Claims, 4 Drawing Sheets

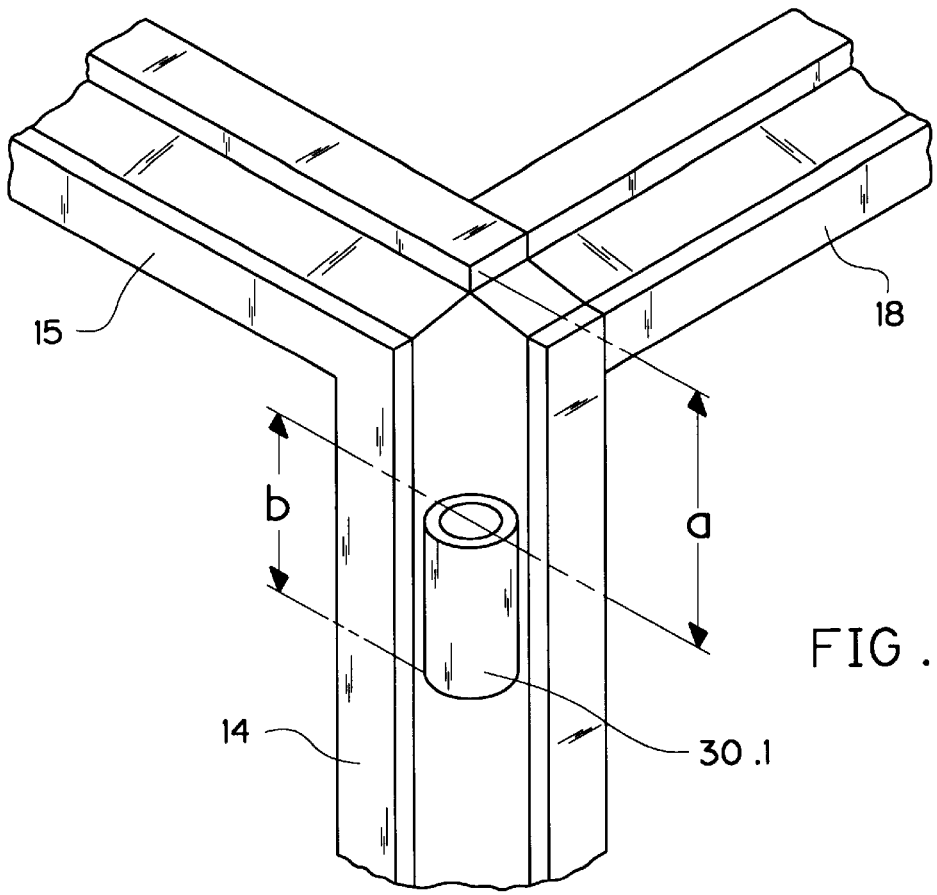
FIG. 2
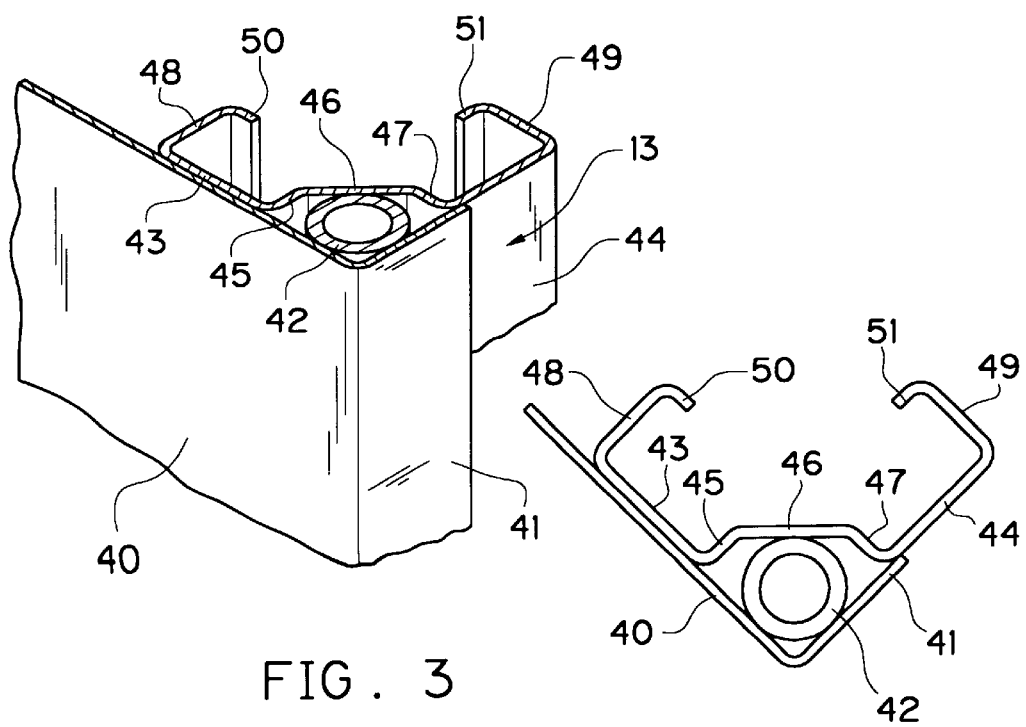
FIG. 3
FIG. 3A

SWITCHGEAR CABINET WITH A FRAME AND DOOR ELEMENTS

BACKGROUND OF THE INVENTION

1. Field of the Invention

This invention relates to a switchgear cabinet with door elements, wherein the door elements can be hinged, locked and unlocked by hinge elements and closure elements at two adjoining vertical sides, wherein symmetrically with the center of a longitudinal dimension the sides have at least two sleeve-shaped connecting elements which can be used as either a hinge element or a closure element. On an interior the door elements have, symmetrically with respect to the center axis, hinge elements for hinge bolts oriented toward the respective connecting element on the hinge side, and on the closure side have counter-closure elements oriented toward the respective connecting elements.

2. Description of Prior Art

A switchgear cabinet of this type is known from Swiss Patent Reference CH 487 575. The door elements of this known switchgear cabinet can be hinged, locked and unlocked by hinge elements and closure elements at two adjoining vertical sides. On interiors, the door elements have, also symmetrically with the horizontal center axis, on the hinge side hinge elements for hinge bolts oriented toward the respective closure elements, and on the closure side counter-closure elements oriented toward the respective connecting elements.

One door element of this known switchgear cabinet closes the entire front or back. In this case the door element can be fastened on the left or the right. But it is not possible to attach the door element selectively on one of two sides of the switchgear cabinet which are placed vertically with respect to each other. The switchgear cabinet furthermore is not suited to have one of its sides closed by means of two door elements.

SUMMARY OF THE INVENTION

It is one object of this invention to provide a switchgear cabinet of the species mentioned at the outset, so that every side of the switchgear cabinet can be selectively closed by a door element extending over an entire height, or by two door elements respectively extending over half of the height.

In accordance with this invention this object is attained with a switchgear cabinet that has a rack with frame legs, wherein outer edges of the frame legs form free exterior corner areas by inclined profiled corner sections. The profiled corner areas form an obtuse angle with the joined exterior profiled sections of the frame legs. Pairs of connecting elements are attached symmetrically with respect to a horizontal center plane of the switchgear cabinet to the inclined profiled corner sections of all vertical frame legs. The two connecting elements of the pairs are each disposed on the vertical frame legs symmetrically with respect to the center planes of the upper and lower cabinet halves.

It is thus possible for two pairs of connecting elements on one vertical frame leg to utilize each side of the switchgear cabinet for attaching a door element. Furthermore, two oppositely located sides of the switchgear cabinet can also be closed by door elements. It is furthermore possible in every case to utilize two door elements for closing the upper and the lower cabinet half, in place of a door element extending over the entire height of the switchgear cabinet.

The distribution of the connecting elements on a vertical frame leg is preferably selected so that the sleeve-shaped connecting elements of the vertical frame legs have an axial dimension and are attached at a distance from the upper and lower side of the switchgear cabinet and the horizontal center plane of the switchgear cabinet.

In accordance with one embodiment, for hinging a door element the hinge elements at the door elements are embodied as axially distanced double sleeves, with receptacles for the hinge bolts correspond to the receptacles of the sleeves of the vertical frame elements used as connecting elements and receive a connecting element of a vertical frame leg between the two sleeves of the hinge elements. However, hinging can also be designed such that the hinge elements of a door element are embodied as sleeves, which adjoin the front sides of the connecting elements and either face each other or face away from each other, of a vertical frame leg and form receptacles for hinge bolts which correspond to the receptacles of the connecting elements of the vertical frame legs.

In accordance with an embodiment, to close the door element at a vertical frame leg the counter-closure elements of the door elements are designed as closure bolts, which are adjustably guided in sleeves fixed on the inside of the door element and can be inserted into the connecting elements of the vertical frame legs used as closure receptacles and can be removed. In this case the embodiment has the counter-closure elements embodied as closure bolts which are a part of pushrods of a pushrod closure and can be adjusted in opposite direction to each other by means of a pushrod lock.

A space of sufficient size in the outer corner area of the frame legs is created with the profiled corner sections of the frame legs at an angle of 135° with respect to the two adjoining exterior profiled sections placed vertically with respect to each other. The frame legs are preferably embodied as open or closed hollow profiled sections, wherein profiled corner sections of the frame legs can make a transition into exterior profiled sections with transition sections, wherein the transition sections are preferably placed vertically with respect to the exterior profiled sections.

A flush finish of the switchgear cabinet in the vertical exterior corner areas is achieved with connecting elements of the vertical frame legs ending flush with the exterior profiled sections. In this way, when the door element is closed the door elements have a beveled edge and the hinge elements and the counter-closure elements of the door elements are disposed in or received on free exterior corner areas of the vertical frame legs.

In connection with a door element which is intended for the entire height of the switchgear cabinet, on the hinge side the door element extends over the entire height of the switchgear cabinet and has hinge elements on the hinge side, which are oriented toward the two pairs of connecting elements of the vertical frame legs, while on the closure side the connecting elements of a vertical frame leg facing the closure side of the door element are used in pairs as receptacles for the pushrods of two pushrod closures. One pushrod closure is assigned to the upper pair of connecting elements and the other pushrod closure is assigned to the lower pair of connecting elements.

However, with a door element which only extends over half the height of the switchgear cabinet and is intended to close the upper of the lower half of the cabinet, the door elements extend over the upper and the lower half of the height of the switchgear cabinet and support the closing elements and hinge elements oriented toward the upper pairs of connecting elements as well as the lower pairs of adjoining vertical frame legs, as well as a pushrod closure.

BRIEF DESCRIPTION OF THE DRAWINGS

This invention will be explained in detail by means of different exemplary embodiments represented in the drawings wherein:

FIG. 2 is a perspective partial view of the area II as shown in FIG. 1;

FIG. 3 is a schematic partial view of the hinging of a door element on a vertical frame leg;

FIG. 3A is a top view of the hinging of a door element on a vertical frame leg;

DESCRIPTION OF PREFERRED EMBODIMENTS

Figure 1:
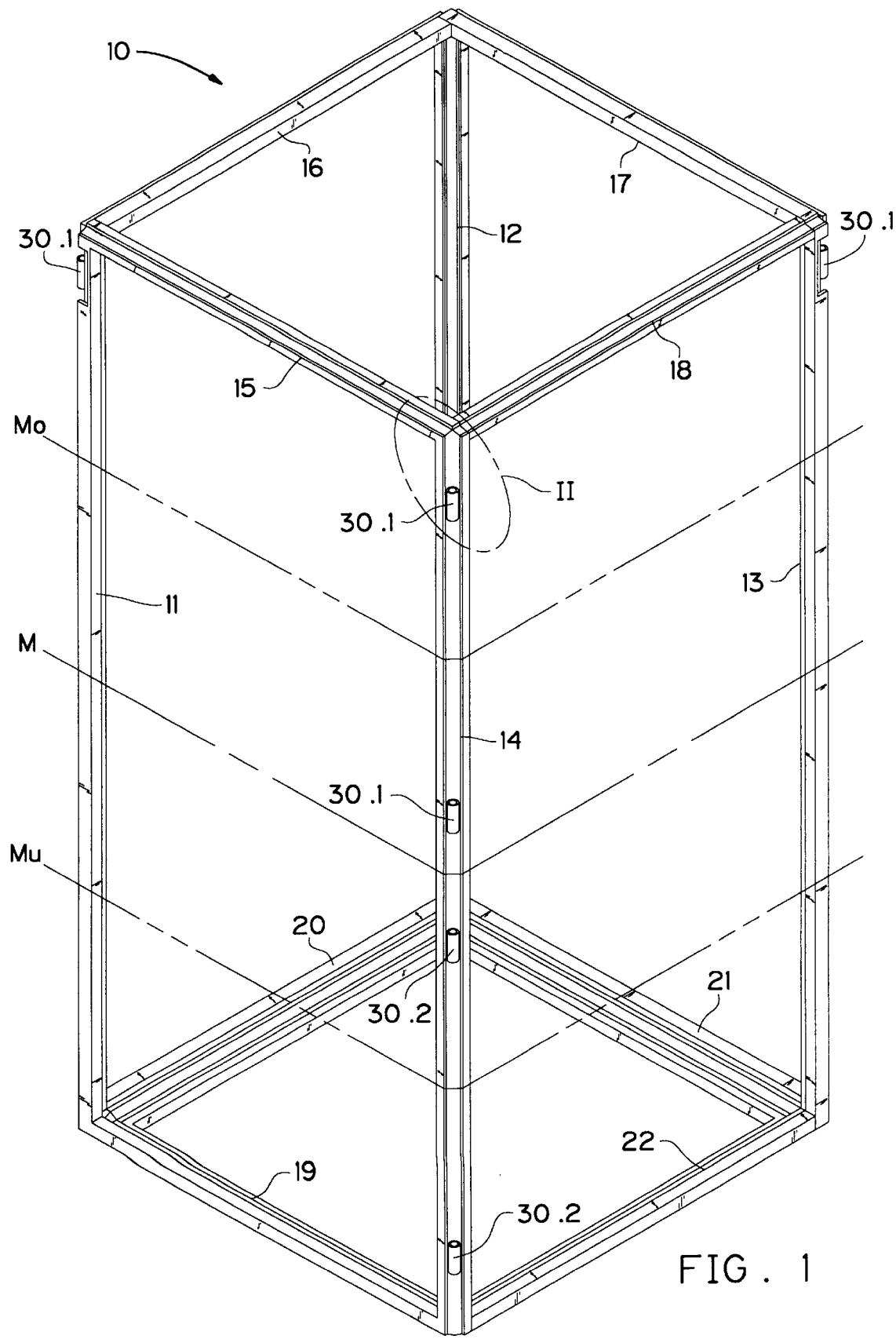
FIG. 1 is a perspective view of a rack for a switchgear cabinet with vertical frame legs that have connecting elements.

The rack 10 in accordance with FIG. I is assembled with the frame legs 11 to 22, wherein preferably profiled sections of the same cross section are used. These frame legs 11 to 22 can be embodied as open or closed hollow profiles and are connected in a known manner, in corner areas by means of corner connectors. With the rack 10 in FIG. 1, the frame legs 11, 14, 15 and 19 can also be connected into a solid frame. The same applies to the frame legs 12, 13, 17 and 21. But the frames can also be formed from the four lateral frame legs 11, 12, 16 and 20 or 13, 14, 18 and 22. The two frames are then connected with each other by means of four connecting struts 16, 18,20 and 22 or 15, 17, 19 and 21.

Finally, the upper or lower four frame legs 15, 16, 17 and 18 or 19, 20, 21 and 22 can be connected to form solid frames, so that the four vertical frame legs 11 to 14 connect the two frames. The frame legs 11 to 22 can be provided on inward-facing profiled sides with rows of fastening receptacles, so that mounting chassis, fastening rails, build-ins and the like can be installed in the rack 10.

The horizontal center plane M is shown in FIG. 1, which divides the frame legs 11 to 14 into two sections of equal length. The upper cabinet half is also divided into two sections of equal size by the horizontal center plane Mo, and the lower cabinet half by the horizontal center plane Mu. Each vertical frame leg 11 to 14 now supports two pairs of connecting elements 30.1 and 30.2. The pairs of connecting elements 30.1 and 30.2 are arranged symmetrically with respect to the center plane Mo. The pairs of connecting elements 30.1 and 30.2 are also arranged in the assigned cabinet halves with respect to the center planes Mo and Mu of the cabinet halves. A door element extending over the entire height of the switchgear cabinet can utilize all four connecting elements 30.1 to 30.2 for the hinge or closure side, which will be explained below.

The frame legs 11 to 22 of the exemplary embodiment are embodied as open hollow profiled sections, as shown in FIGS. 3 and 3A. In this case the outer edges of the frame legs are beveled by means of the profiled corner sections 46. This profiled corner section 46 makes a transition into the exterior profiled sections 43 and 44 by means of the transition sections 45 and 47. These transition sections 45 and 47 are preferably placed vertically with respect to the adjoining exterior profiled sections 43 and 44. The adjoining exterior profiled sections 43 and 44 are placed at right angles with respect to each other. A continuous axial receptacle, which provides space for the connecting elements 30.1 and 30.2, is thus created in the exterior corner area of the frame legs 11 to 22. The connecting elements 30.1 and 30.2 are designed to end flush with the exterior profiled sections 43 and 44.

As FIG. 2 shows, connecting elements 30.1 and 30.2 are used, which have a length b and are attached to the vertical frame legs 11 to 14 at a distance a from the top or underside of the switchgear cabinet. The respective other connecting elements 30.1 and 30.2 keep this distance a from the center plane M, as can be seen in FIG. 1.

Figure 4:
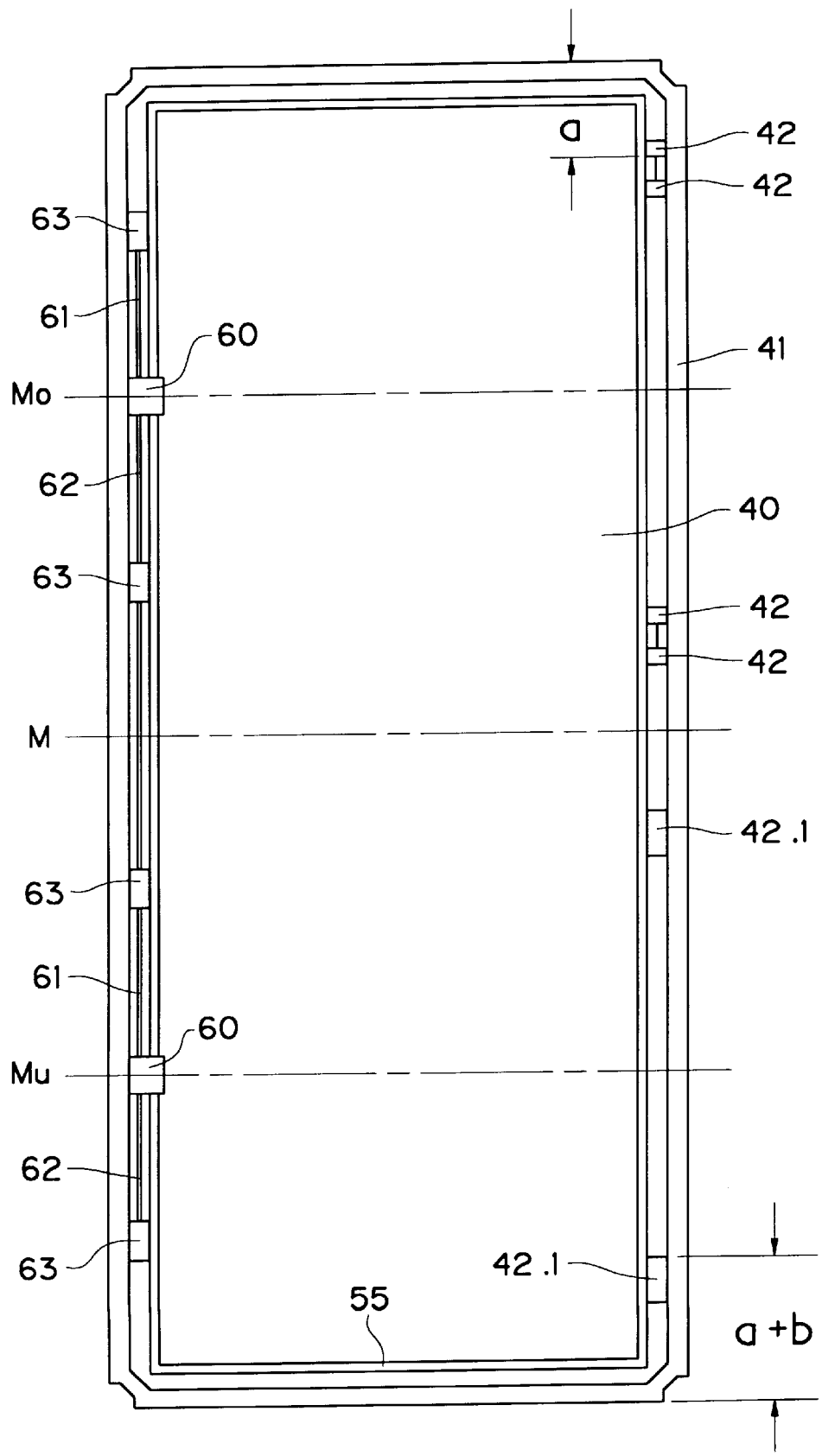
FIG. 4 is a view of an inside of a door element extending over the entire height of the switchgear cabinet.

The door element 40 in FIG. 4 is laid out in such a way that the door element 40 completely covers the cabinet side. Four hinge elements are attached in the area of the closure side on the inside of the door element 40, which has a beveled edge 41, each oriented toward one of the four connecting elements 30. 1 and 30.2. As shown by the hinge element 42, it can be designed as a double sleeve, wherein the two sleeves are spaced apart and can receive a connecting element 30 of the dimension b. The hinge elements can also be embodied as single sleeves as shown by the hinge elements 42.1. The orientation of these hinge elements 42.1 can be selected to be such that they adjoin one of the front ends of a connecting element 30.1 or 30.2. The connecting elements 30.1 and 30.2 and the hinge elements 42 and 42.1 have receptacles of the same size, into which a hinge bolt can be inserted. Therefore the door element 40 can be hinged at four sides on a vertical frame leg 11 to 14.

In the area of the closure side, the inside of the door element 40 has closure elements 63, which adjoin the facing front ends of the pairs of connecting elements 30.1 or 30.2 of a frame leg when the door element 40 is closed. The upper half of the door element 40 has a first pushrod closure with the closure 60 and the two pushrods 61 and 62, whose end is guided in the associated closure elements 63. If the closure is brought into the locked position, the pushrods 61 and 62 are inserted into the closure elements 63.

In the lower cabinet half the door element 40 is connected by means of a further pushrod closure with the facing vertical frame leg. Because the door element 40 is embodied symmetrically with respect to the center plane M, the door element 40 can be fastened both on the right as well as the left. To this end it merely needs to be rotated by 180°. In this case it is preferably equipped with uniform closure elements 42 or 42.1. Outside of the area of the hinge elements 42 or 42.1 and of the pushrod closure, the door element 40 can be reinforced by means of a reinforcement and assembly frame 55. In the exemplary embodiment the pushrods 61 and 62 form the counter-closure elements.

A door element 40 can be similarly employed for closing the respectively opposite side of the rack 10. Thus, a door element 40 can close the front or the back of the rack 10, for example. It is also possible to use two of the same door elements 40 in a freely selectable fastening mode for closing the front and back of the rack 10. In place of the front and back of the rack 10 it is also possible to close the two remaining sides of the rack 10 with one or two door elements 40 of appropriate size. The attachment of the closure elements 63 and the hinge elements 42 or 42.1 must always be matched to the arrangement of the connecting elements 30.1 or 30.2 at the vertical frame legs 11 to 14.

Figure 5:
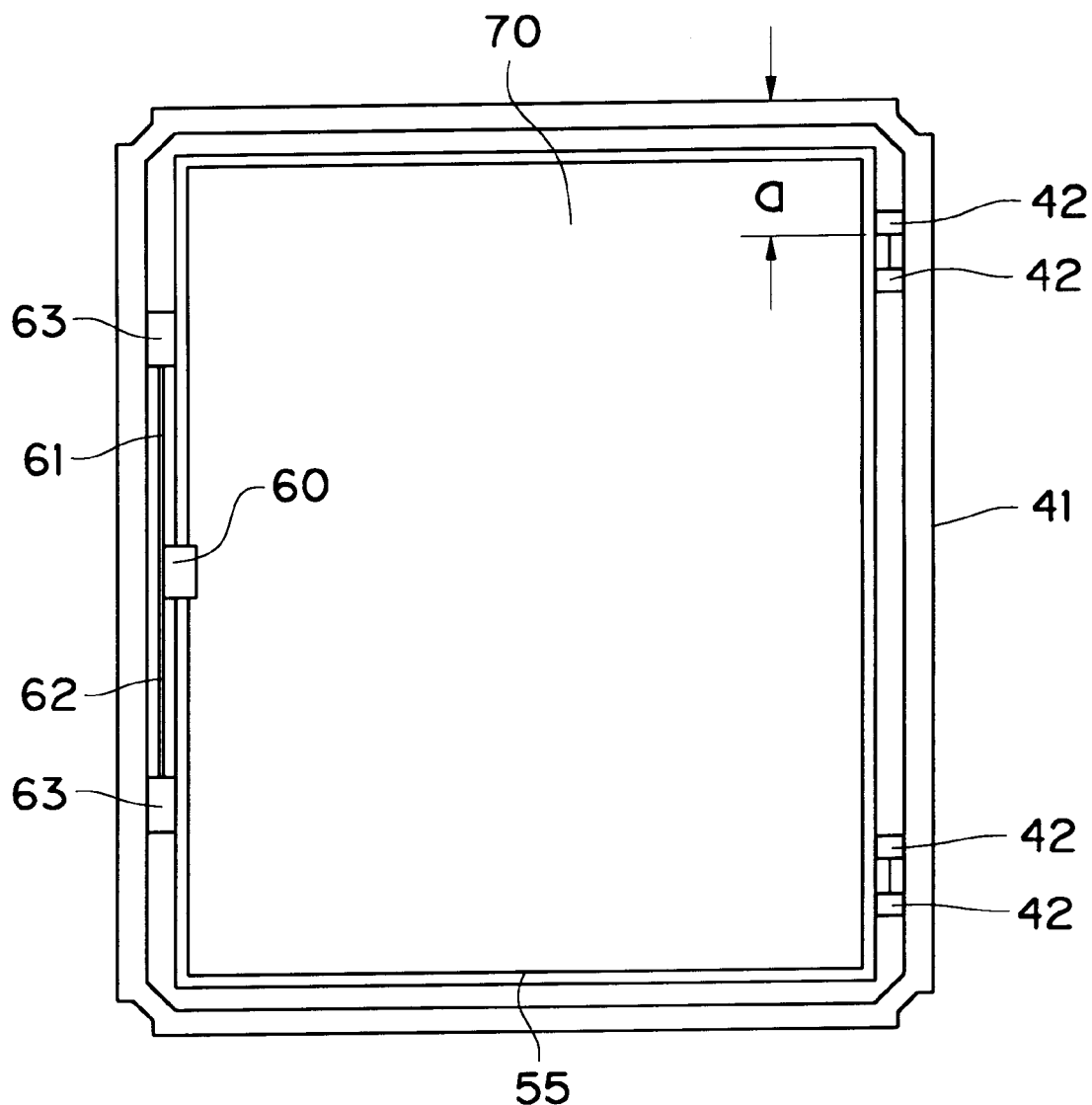
FIG. 5 is a view of an inside of a door element, which extends over only half the height of the switchgear cabinet and which closes the upper half or the lower half of the switchgear cabinet.

As shown in FIG. 5, a small door element 70 can also be used for closing the upper or lower cabinet half. The hinge elements 42 on the hinge side are arranged in accordance with the distance a and the length b and are oriented toward the pair of connecting elements 30.1 or 30.2 in such a way, that the door element 70 can be hinged to the vertical frame legs 11 to 14. On the closure side, the closure elements 63, the pushrods 61 and 62 and the closure of the pushrod lock are oriented toward the pair of connecting elements 30.1 or 30.2, so that the pushrods 61 and 62 can be inserted into the facing connecting elements 30.1 or 30.2 of a vertical frame leg 11 to 14 as locking bolts. Thus it is possible to arrange two door elements 70 on one cabinet side, one above the other, and the door elements 70 can be closed and opened independently of each other. The smaller door element 70 is also reinforced on an inside by means of a reinforcement and assembly frame 55.

We claim:

1. In a switchgear cabinet having a plurality of door elements which can be locked and unlocked by hinge elements and closure elements at two adjoining vertical sides, wherein symmetrically with a center axis of a longitudinal dimension the vertical sides have at least two sleeve-shaped connecting elements, and wherein on an interior each of the door elements has symmetrically with respect to the center axis a plurality of hinge elements for hinge bolts oriented toward a respective one of the connecting elements on a hinge side, and on a closure side having a plurality of counter-closure elements oriented toward the respective connecting elements, the improvement comprising:

a rack (10) having a plurality of frame legs (11 to 22), outer edges of the frame legs (11 to 22) forming a plurality of free exterior corner areas with a plurality of inclined profiled corner sections (46), the profiled corner sections (46) forming an obtuse angle with a plurality of joined exterior profiled sections (43,44) of the frame legs (11 to 22), a pair of connecting elements (30.1, 30.2) attached symmetrically with respect to a horizontal center plane (M) of the switchgear cabinet to the profiled corner sections (46) of vertical ones of the frame legs (11 to 14), and the connecting elements (30.1, 30. 2) disposed on the vertical ones of the frame legs (11 to 14) symmetrically with respect to an upper center plane (Mo) of an upper cabinet half and a lower center plane (Mu) of a lower cabinet half.

2. In a switchgear cabinet in accordance with claim 1, wherein the connecting elements (30.1, 30.2) of the vertical frame legs (11 to 14) have an axial dimension (b) and are attached at a distance (a) from an upper side and a lower side of the switchgear cabinet and the horizontal center plane (M) of the switchgear cabinet.

3. In a switchgear cabinet in accordance with claim 2, further comprising a plurality of hinge elements (42), a plurality of door elements (40, 70) and a plurality of hinge bolts, wherein the hinge elements (42) at the door elements (40, 70) are formed as axially distanced double sleeves with receptacles for the hinge bolts that correspond to the receptacles of a plurality of first sleeves of the frame legs (11 to 14) that receive the connecting elements (30.1, 30.2) of one of the frame legs (11 to 14) between two second sleeves of the hinge elements (42).

4. In a switchgear cabinet in accordance with claim 2, further comprising a plurality of hinge elements (42.1), a plurality of door elements (40, 70), wherein the hinge elements (42.1) of one of the door elements (40, 70) are sleeves which adjoin a plurality of front sides of the connecting elements (30.1, 30.2) of one of the frame legs (11 to 14) and form receptacles for a plurality of hinge bolts which correspond to the connecting elements (30.1, 30.2) of the frame legs (11 to 14).

5. In a switchgear cabinet in accordance with claim 4, wherein a plurality of pushrods (61, 62) of the door elements (40, 70) are each formed as a closure bolt which is adjustably guided in a closing element (63) fixed on the interior of one of the door elements (40, 70) and which can be inserted into the connecting elements (30.1, 30.2) of the frame legs (11 to 14).

6. In a switchgear cabinet in accordance with claim 5, wherein the pushrods (61, 62) which are embodied as the closure bolts which are each a part of a pushrod closure can be adjusted in opposite direction to each other by a pushrod lock (60).

7. In a switchgear cabinet in accordance with claim 6, wherein the profiled corner sections (46) of the frame legs (11 to 22) are positioned at an angle of 135° with respect to the exterior profiled sections (43, 44) which are positioned vertically with respect to each other, and the frame legs (11 to 22) are preferably embodied as one of an open hollow profiled section and a closed hollow profiled section.

8. In a switchgear cabinet in accordance with claim 7, wherein the profiled corner sections (46) make a transition into the exterior profiled sections (43, 44) by a plurality of transition sections (45, 47) which are placed vertically with respect to the exterior profiled sections (43, 44).

9. In a switchgear cabinet in accordance with claim 8, wherein the connecting elements (30.1, 30.2) of the frame legs (11 to 14) end flush with the exterior profiled sections (43, 44).

10. In a switchgear cabinet in accordance with claim 9, wherein the door elements (40, 70) have a beveled edge (41), and the hinge elements (42) and the pushrods (61, 62) of the door elements (40, 70) are positioned in free exterior corner areas of the frame legs (11 to 14).

11. In a switchgear cabinet in accordance with claim 10, wherein one of the door elements (40) extends over an entire height of a switchgear cabinet and the hinge elements (42) are oriented toward the connecting elements (30.1, 30.2) of the frame legs (11 to 14).

12. In a switchgear cabinet in accordance with claim 11, wherein the connecting elements (30.1, 30.2) of the frame legs (11 to 14) facing a closure side of one of the door elements (40) are used in pairs as receptacles for pushrods of two pushrod closures, wherein one of the pushrod closures is assigned to an upper one of the connecting elements (30. 1) and another of the pushrod closures is assigned to a lower one of the connecting elements (30.2).

13. In a switchgear cabinet in accordance with claim 10, wherein one of the door elements (70) extends over an upper cabinet half and a lower cabinet half of a height of the switchgear cabinet and supports the closing element (63) and the hinge elements (42) oriented toward the upper one of the connecting elements (30.1) and the lower one of the connecting elements (30. 2) of the frame legs (11 to 14) and the pushrod closure.

14. In a switchgear cabinet in accordance with claim 1, further comprising a plurality of hinge elements (42.1), a plurality of door elements (40, 70) and a plurality of hinge bolts, wherein the hinge elements (42) at the door elements (40, 70) are formed as axially distanced double sleeves with receptacles for the hinge bolts that correspond to the receptacles of a plurality of first sleeves of the frame legs (11 to 14) that receive the connecting elements (30.1, 30.2) of one of the frame legs (11 to 14) between two second sleeves of the hinge elements (42).

15. In a switchgear cabinet in accordance with claim 1, further comprising a plurality of hinge elements (42.1), a plurality of door elements (40, 70), wherein the hinge elements (42.1) of one of the door elements (40, 70) are sleeves which adjoin a plurality of front sides of the connecting elements (30.1, 30.2) of one of the frame legs (11 to 14) and form receptacles for a plurality of hinge bolts which correspond to the connecting elements (30.1, 30.2) of the frame legs (11 to 14).

16. In a switchgear cabinet in accordance with claim 1, further comprising a plurality of door elements (40, 70), wherein a plurality of pushrods (61, 62) of the door elements (40, 70) are each formed as a closure bolt which is adjustably guided in a closing element (63) fixed on the interior of one of the door elements (40, 70) and which can be inserted into the connecting elements (30.1, 30.2) of the frame legs (11 to 14).

17. In a switchgear cabinet in accordance with claim 1, wherein the profiled corner sections (46) of the frame legs (11 to 22) are positioned at an angle of 135° with respect to the exterior profiled sections (43, 44) which are positioned vertically with respect to each other, and the frame legs (11 to 22) are preferably embodied as one of an open hollow profiled section and a closed hollow profiled section.

18. In a switchgear cabinet in accordance with claim 1, wherein the profiled corner sections (46) make a transition into the exterior profiled sections (43, 44) by a plurality of transition sections (45, 47) which are placed vertically with respect to the exterior profiled sections (43, 44).

19. In a switchgear cabinet in accordance with claim 1, wherein the connecting elements (30.1, 30.2) of the frame legs (11 to 14) end flush with the exterior profiled sections (43, 44).

20. In a switchgear cabinet in accordance with claim 1, further comprising a plurality of door elements (40, 70), a plurality of hinge elements (42), wherein the door elements (40, 70) have a beveled edge (41), and the hinge elements (42) and a plurality of pushrods (61, 62) of the door elements (40, 70) are positioned in free exterior corner areas of the frame legs (11 to 14).

* * * * *